US009771651B2

(12) United States Patent
Wochner

(10) Patent No.: US 9,771,651 B2
(45) Date of Patent: Sep. 26, 2017

(54) PROCESS FOR PRODUCING POLYCRYSTALLINE SILICON

(71) Applicant: Wacker Chemie AG, Munich (DE)

(72) Inventor: Hanns Wochner, Burghausen (DE)

(73) Assignee: Wacker Chemie AG, Munich (DE)

( * ) Notice: Subject to any disclaimer, the term of this patent is extended or adjusted under 35 U.S.C. 154(b) by 0 days.

(21) Appl. No.: 15/032,227

(22) PCT Filed: Oct. 17, 2014

(86) PCT No.: PCT/EP2014/072328
§ 371 (c)(1),
(2) Date: Apr. 26, 2016

(87) PCT Pub. No.: WO2015/062880
PCT Pub. Date: May 7, 2015

(65) Prior Publication Data
US 2016/0273099 A1   Sep. 22, 2016

(30) Foreign Application Priority Data
Oct. 28, 2013 (DE) .................. 10 2013 221 826

(51) Int. Cl.
| | | |
|---|---|---|
| C23C 16/24 | (2006.01) | |
| C01B 33/03 | (2006.01) | |
| C23C 16/442 | (2006.01) | |
| C01B 33/027 | (2006.01) | |
| C01B 33/035 | (2006.01) | |
| F24F 3/16 | (2006.01) | |

(52) U.S. Cl.
CPC .......... *C23C 16/442* (2013.01); *C01B 33/027* (2013.01); *C01B 33/03* (2013.01); *C01B 33/035* (2013.01); *F24F 3/161* (2013.01)

(58) Field of Classification Search
CPC . C23C 16/29; C23C 16/4402; C23C 16/4412; C23C 16/24; C01B 33/03
See application file for complete search history.

(56) References Cited

U.S. PATENT DOCUMENTS

| | | | | |
|---|---|---|---|---|
| 5,620,369 | A * | 4/1997 | Spransy ................ | F24F 3/161 454/187 |
| 5,834,528 | A * | 11/1998 | Tanaka ............... | B01D 39/1692 264/235.8 |
| 6,309,467 | B1 | 10/2001 | Wochner et al. | |
| 2005/0268585 | A1* | 12/2005 | Morse ................. | B01D 46/008 55/502 |
| 2008/0078289 | A1* | 4/2008 | Sergi .................. | B01D 46/0013 95/25 |
| 2010/0154357 | A1 | 6/2010 | Wochner et al. | |
| 2012/0060562 | A1* | 3/2012 | Wochner ............ | B23K 13/015 65/441 |
| 2013/0186325 | A1 | 7/2013 | Wochner et al. | |
| 2013/0189176 | A1 | 7/2013 | Wochner et al. | |
| 2013/0216466 | A1* | 8/2013 | Traunspurger .... | H01L 21/02046 423/348 |

FOREIGN PATENT DOCUMENTS

| | | |
|---|---|---|
| DE | 10 2007 027 110 A1 | 12/2008 |
| DE | 10 2011 004 916 A1 | 9/2012 |
| EP | 1 291 063 A2 | 3/2003 |
| EP | 2 431 329 A1 | 3/2012 |
| EP | 2 479 142 A1 | 7/2012 |
| WO | 2010039570 A2 | 4/2010 |

\* cited by examiner

*Primary Examiner* — Bret Chen
(74) *Attorney, Agent, or Firm* — Brooks Kushman P.C.

(57) ABSTRACT

Polycrystalline silicon with low contamination by impurities, especially boron and phosphorus, is manufactured by the Siemens process or by the fluidized bed process, in which deposition of polycrystalline silicon takes place in a reactor maintained within a clean room of the 1 to 100,000 class, and air entering the facility enclosing the reactors is filtered by a multiple stage filtration system wherein coarse and fine filter elements contain less than 0.1% by weight of boron and phosphorus and less than 0.01% by weight of arsenic and aluminum. Following production of the polycrystalline silicon, the polycrystalline silicon may be further treated by steps such as comminution, classifying, wet-chemical treatment, and packing, all these further steps also preferably taking place within a clean room of the 1 to 100,000 class.

9 Claims, 1 Drawing Sheet

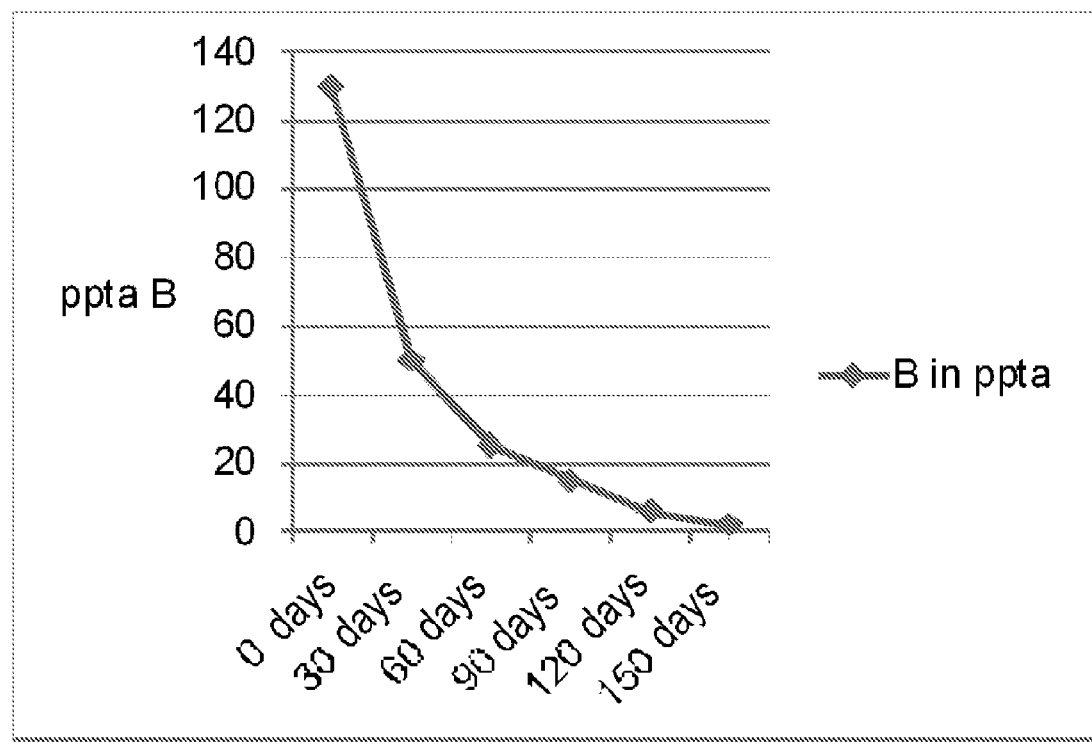

PROCESS FOR PRODUCING POLYCRYSTALLINE SILICON

CROSS REFERENCE TO RELATED APPLICATIONS

This application is the U.S. National Phase of PCT Appln. No. PCT/EP2014/072328 filed Oct. 17, 2014, which claims priority to German Application No. 10 2013 221 826.5 filed Oct. 28, 2013, the disclosures of which are incorporated in their entirety by reference herein.

BACKGROUND OF THE INVENTION

1. Field of the Invention

The invention relates to a process for producing polycrystalline silicon.

2. Description of the Related Art

Polycrystalline silicon, often also called polysilicon for short, is typically produced by means of the Siemens process. This involves heating thin filament rods of silicon by direct passage of current in a bell jar-shaped reactor ("Siemens reactor"), and introducing a reaction gas comprising a silicon-containing component and hydrogen.

The silicon-containing component of the reaction gas is generally monosilane or a halosilane of the general composition $SiH_nX_{4-n}$ (n=0, 1, 2, 3; X=Cl, Br, I). It is preferably a chlorosilane or chlorosilane mixture, more preferably trichlorosilane. Predominantly $SiH_4$ or $SiHCl_3$ (trichlorosilane, TCS) is used in a mixture with hydrogen.

In the Siemens process, the filament rods are typically inserted vertically into electrodes present at the reactor base, through which they are connected to the power supply. Every two filament rods are coupled via a horizontal bridge (likewise composed of silicon) and form a support body for the silicon deposition. The bridge coupling produces the typical U shape of the support bodies, which are also called thin rods.

High-purity polysilicon is deposited on the heated rods and the bridge, as a result of which the rod diameter grows with time (CVD/gas phase deposition).

After the deposition has ended, these polysilicon rods are typically processed further by means of mechanical processing to give chunks of different size classes, classified, optionally subjected to a wet-chemical cleaning operation and finally packed.

An alternative to the Siemens process is that of fluidized bed processes, in which polycrystalline silicon granules are produced. This is accomplished by fluidizing silicon particles by means of a gas flow in a fluidized bed, the latter being heated to high temperatures by means of a heating apparatus. Addition of a silicon-containing reaction gas results in a pyrolysis reaction at the hot particle surface. This deposits elemental silicon on the silicon particles, and the individual particles grow in diameter. The regular removal of particles that have grown and addition of smaller silicon particles as seed particles allow the process to be operated continuously with all the associated advantages. Silicon-containing reactant gases that have been described are silicon-halogen compounds (e.g. chlorosilanes or bromosilanes), monosilane (SiH4), and mixtures of these gases with hydrogen.

Since the quality demands on polysilicon are becoming ever higher, constant process improvements with regard to contamination by metals or dopants are necessary. A distinction has to be made here between contamination in the bulk and contamination at the surface of the polysilicon chunks/rod pieces, or of the polysilicon granules.

It is known that the process steps for producing polysilicon, such as the comminution of rods, have an influence on the surface contamination by metals and dopants.

In the prior art, efforts have been made to study the influence of an individual process step on any surface contamination of polysilicon with dopants.

US 2013/0189176 A1 discloses a polycrystalline silicon chunk having a concentration of 1-50 ppta of boron and 1-50 ppta of phosphorus at the surface.

The surface dopant contamination of polycrystalline silicon can be determined by analyzing one of two polycrystalline rods produced by deposition in a Siemens reactor for contamination with dopants (bulk and surface) immediately after the deposition, while the second rod passes through the plants in which the rod is processed further and, after passing through the plants, is likewise analyzed for contamination with dopants (bulk and surface). Since the two rods can be assumed to have the same level of bulk contamination, finding the difference between the two contaminations found gives the surface contamination which is caused by the further processing steps, such as comminution, cleaning, transport and packing. This can be ensured at least when the rod and brother rod have been deposited on one and the same U-shaped support body. This process, to which reference is made hereinafter, is described in US 2013/0186325 A1.

In the context of US 2013/0189176 A1, dopants (B, P, As, Al) are analyzed by means of photoluminescence according to SEMI MF 1398 on an FZ single crystal produced from the polycrystalline material (SEMI MF 1723). A wafer is separated from the monocrystalline rod produced by means of FZ from a polycrystalline silicon rod or from polycrystalline silicon chunks, etched with $HF/HNO_3$, rinsed with 18 MOHm water and dried. Photoluminescence measurements are conducted on this wafer.

In order to produce the polycrystalline silicon chunks, the deposited silicon rod has to be comminuted. The comminution is effected to US 2013/0189176 A1 after a preliminary comminution by means of a hammer on a workbench or by means of a crusher, for example with a jaw crusher. Both systems, both the workbench and hammer for preliminary comminution and the crusher, are within a cleanroom of the 10,000 class or lower. Preferably, the systems are within a cleanroom of the 100 class or better (according to US FED STD 209E, succeeded by ISO 14644-1). In the case of class 100 (ISO 5), max. 3.5 particles of max. diameter 0.5 μm may be present per liter. In the cleanroom, exclusively cleanroom filters having a PTFE membrane are used. It should be ensured that the filters are free of boron. Therefore, the filter medium must not consist of glass fibers.

The comminution and classification of the chunks are optionally followed by a wet-chemical treatment of the chunks in a cleaning system. The cleaning system is within a cleanroom of the 10,000 class or lower, preferably in a cleanroom of the 100 class or better. Here too, exclusively cleanroom filters having a PTFE membrane are used, with a construction and a composition as described above.

DE 10 2011 004 916 A1 discloses a process for drying polysilicon, wherein an air stream is conducted through a filter at a flow rate of 0.1 to 3 m/s and a temperature of 20 to 100° C., then passes through a perforated air division plate and is then directed onto a process dish containing polysilicon, in order to dry it.

Air filters which are currently used in cleanrooms comprise ULPA (ultra low penetration air) and HEPA (high efficiency particle air) filters. The filter mats used are in most cases mounted in plywood or metal frames, in order to be able to change them easily. The filter medium itself consists, like most air filters, of glass fiber mats having a fiber diameter of about 1-10 µm.

EP 1 291 063 A1 discloses a cleanroom comprising an air filter, in which any gap between a filter medium and a frame is sealed by a sealant material, the entire filter medium and the sealant material being formed from a material that releases gaseous organic phosphorus compounds in an amount of 10 µg or less per 1 g of material, measured by a purge & trap method, and leaches boron compounds in an amount of 20 µg or less per 1 g of material after immersion in ultrapure water for 28 days. The air filter is produced by treating glass fibers or organic fibers, for instance those composed of polytetrafluoroethylene, with a treatment agent comprising, for example, a binder produced from an acrylic resin or the like, a non-silicon water repellent, a plasticizer and an antioxidant, and in this way a nonwoven filter medium is formed, the filter medium is placed into a frame having a given size and a section between the frame and the filtration medium is sealed securely with a sealing material, the treatment agent and the sealing material chosen and used being those which do not form any gaseous organic substances during the use of the cleanroom.

However, it has been found that, as well as the boron-containing glass fiber filters, the low-dopant filters with a PTFE membrane are also incapable of achieving a deposition level of more than 99% in the case of direct suction of the air feed. Particulate measurements show that 10,000 per cubic foot are measured for <0.05 µm particles, and 20,000 per cubic foot for 0.05-0.1 µm particles. Moreover, the filters were blocked with soil to such an extent after four weeks that the mean flow rate had dropped to below 0.1 m/s, and hence it was no longer possible to maintain cleanroom conditions.

In the process described in US 2013/0186325 A1, rods were laid out in a cleanroom for 6 hours. Subsequently, the surface contamination on the rods was determined. The air was sucked in directly from the outside air by means of ventilators and passed through low-dopant airborne particle filters of the U 17 class (to EN 1822-1:2009) with a PTFE membrane.

Table 1 shows the surface contamination determined.

TABLE 1

| B/ppta | P/ppta | Al/ppta | As/ppta | C/ppba | Dopants/ppta |
|---|---|---|---|---|---|
| 250 | 18 | 2 | 2 | 1.23 | 272 |

According to US 2013/0189176 A1, however, polycrystalline silicon should have the following maximum surface contamination: B<50 ppta; P<50 ppta; As<5 ppta; Al<5 ppta.

The incorporation of preliminary filter systems can reduce surface contamination with dopants. However, it has been found that, in the case of conventional glass fiber filters, it is possible to achieve the abovementioned quality aims only after an outgassing phase of several months; cf. comparative example 2 and FIG. 1. During the outgassing phase, the filters appear to release small particles which cannot be retained even by airborne particle filters of the U17 class, no matter whether they consist of glass fiber mats or of PTFE. This problem gave rise to the objective of the invention.

SUMMARY OF THE INVENTION

These and other objects are achieved by a process for producing polycrystalline silicon, comprising a deposition of polycrystalline silicon on a support body, in order to obtain a polycrystalline silicon rod, or a deposition of polycrystalline silicon on silicon particles, in order to obtain polycrystalline silicon granules, wherein each deposition is effected in a reactor within a cleanroom of the 1 to 100,000 class, wherein filtered air is conducted into the cleanroom, wherein the air is filtered by first passing it through at least one filter which separates out particles larger than or equal to 1 µm and then through an airborne particle filter which separates out particles smaller than 1 µm.

BRIEF DESCRIPTION OF THE DRAWINGS

FIG. 1 is a plot of surface boron contamination of polysilicon against time for one embodiment of the invention.

DETAILED DESCRIPTION OF THE PREFERRED EMBODIMENTS

The deposition of polycrystalline silicon on a support body is typically effected by introducing reaction gas comprising a silicon-containing component and hydrogen into a reactor containing at least one heated support body on which polycrystalline silicon is deposited, which affords at least one polycrystalline silicon rod.

Preferably, the silicon rod is subsequently comminuted into polycrystalline silicon chunks.

The polycrystalline granules are typically produced in a fluidized bed reactor by fluidizing silicon particles by means of a gas flow in a fluidized bed, the latter being heated to high temperatures by means of a heating apparatus. Addition of a reaction gas comprising a silicon-containing component and optionally hydrogen results in a pyrolysis reaction at the hot particle surface. This deposits elemental silicon on the silicon particles, and the individual particles grow in diameter.

The silicon-containing component is preferably a chlorosilane, more preferably trichlorosilane.

The filter which separates out particles larger than or equal to 1 µm is preferably a fine dust filter for particles of size 1-10 µm, i.e. a filter of classes M5, M6, F7-F9 according to EN 779.

Preferably, the air passes first through a coarse dust filter which separates out >10 µm particles, i.e. a filter of the G1-G4 classes according to EN 779. In this case, the preliminary filtration comprises a coarse dust filter and a fine dust filter.

The airborne particle filter is preferably an airborne particle filter with a PTFE membrane of the E10-E12, H13-H14, U15-U18 classes according to DIN EN 1822. Preference is given to an airborne particle filter with a PTFE membrane of the U15 class (100 class).

It is likewise preferable to use AMC (airborne molecular contamination) filters, for example composed of activated carbon filters or anion filters, in order to separate out any gaseous boron and phosphorus compounds in the air. The AMC filter is connected upstream of the airborne particle filter. If fine dust and coarse dust filters are used in the preliminary filtration, the AMC filter is preferably introduced between the coarse dust filter and airborne particle filter.

In the preliminary filtration (fine and coarse dust filters), filters made from synthetic, low-dopant materials are used. These are preferably mats with a PTFE membrane, comprising polyester fibers or comprising a polypropylene fabric, which contain less than 0.1% by weight of boron and phosphorus and less than 0.01% by weight of arsenic, aluminum and sulfur and <0.1% by weight of Sn. All the adhesives and frames in which the filter mats are installed should likewise contain <0.1% by weight of boron and phosphorus and less than 0.01% by weight of arsenic and aluminum and <0.1% by weight of tin.

It has been found that the preliminarily filtered air does not contain any dopant-containing particles. Therefore, conditions which were achieved in the prior art only after an outgassing phase of several months exist in the cleanroom.

The invention envisages a plurality of filter stages for deposition of particles of different size.

The airborne particle filters should achieve a deposition level of more than 99% for particles of size less than 0.2 μm. It has been found that this can be accomplished by a two-stage preliminary filtration.

Preliminary filter stage 1 provides a coarse dust filter of the G1 to G4 class for >10 μm particles. This consists of a synthetic material, preferably polypropylene or polyester.

Preliminary filter stage 2 provides a fine dust filter of the M5 or M6 or F7 to F9 class for 1 to 10 μm particles. This likewise consists of a synthetic material, preferably polypropylene or polyester.

Final filter stage 3 provides an airborne particle filter of the E10 to U17 class for <1 μm particles. The airborne particle filter also consists of a synthetic material, preferably polypropylene or polyester.

Also possible in principle is a two-stage system composed of a fine dust filter of the M5 or M6 or F7 to F9 class for 1 to 10 μm particles and an airborne particle filter of the E10 to U17 class for <1 μm particles.

Preference is given, however, to a two-stage preliminary filtration with coarse and fine dust filters. This is because it has been found that this extends the lifetime of the airborne particle filters by about 3 months compared to the one-stage preliminary filtration. In the three-stage system, the airborne particle filters last for about 1 to 1.5 years.

Both the deposition of the polycrystalline silicon rods and the comminution of the silicon rods into chunks preferably take place in a cleanroom of the 1 to 100,000 class.

For the deposition, this means that all the reactors in which polycrystalline silicon is deposited are within a cleanroom. This applies both to deposition by the Siemens process and to deposition by means of a fluidized bed process, in order to produce granules. This has the advantage that, even on deinstallation from the reactors, the silicon rods or the granules see clean low-particulate air from the start.

For the comminution, this means that the comminution system is within a cleanroom of the 1 to 100,000 class.

The polycrystalline silicon chunks or polycrystalline silicon granules are optionally classified (for example by chunk sizes). It is preferable that the systems for classification are within a cleanroom of the 1 to 100,000 class.

The polycrystalline silicon chunks are optionally subjected to a wet-chemical treatment. It is preferable that the cleaning systems and driers are within a cleanroom of the 1 to 100,000 class, more preferably within a cleanroom of the 1 to 100 class.

The polycrystalline silicon chunks are typically packed in plastic bags. It is preferable that the packing system is within a cleanroom of the 1 to 100,000 class, more preferably within a cleanroom of the 1 to 100 class. If the polycrystalline silicon chunks have been subjected to wet-chemical treatment and drying beforehand, it is preferable when the entire transport line from cleaning system/drier to the packing system is within a cleanroom of the 1 to 100,000 class, more preferably within a cleanroom of the 1 to 100 class.

EXAMPLES AND COMPARATIVE EXAMPLES

From air handling systems with a different preliminary filtration setup, a cleanroom having airborne particle filters with a PTFE membrane of the U15 class (100 class) installed in the roof is supplied with air.

The analysis of the surface contamination was effected by the process described in US 2013/0186325 A1.

Comparative Example 1

In the air handling system, coarse dust filters of the G4 class composed of glass fibers are present at stage 1, and fine dust filters of the M6 class composed of glass fibers having boron content >10% by weight at stage 2.

In the cleanroom, silicon rods (brother rods) of length 20 cm and diameter 1 cm were laid out for 6 hours.

Subsequently, in accordance with the method described in US 2013/0186325 A1, the values for the surface contamination on the silicon rods reported in table 2 were determined.

TABLE 2

| B/ppta | P/ppta | Al/ppta | As/ppta | C/ppba | Dopants/ppta |
|--------|--------|---------|---------|--------|--------------|
| 130    | 8      | 1       | 0.6     | 7.92   | 139.6        |

Comparative Example 2

In the air handling system, coarse dust filters of the G4 class composed of glass fibers are present at stage 1, and fine dust filters of the M6 class composed of glass fibers having boron content >10% by weight at stage 2.

Directly after the installation of the filters and every four weeks thereafter, brother rods were laid out in the cleanroom for 6 hours each.

Table 3 shows the surface contamination with B, P, Al, As and C found and the sum total of the dopants (B, P, Al, As) directly after the installation of the filters (0 w), after 4 weeks (4 w), after 8 weeks (8 w), after 12 weeks (12 w), after 16 weeks (16 w) and after 20 weeks (20 w).

TABLE 3

|       | B/ppta | P/ppta | Al/ppta | As/ppta | C/ppba | Dopants/ppta |
|-------|--------|--------|---------|---------|--------|--------------|
| 0 w   | 130    | 8      | 1       | 0.6     | 7.92   | 139.6        |
| 4 w   | 50     | 6      | 0.5     | 0.3     | 7.92   | 56.8         |
| 8 w   | 30     | 4      | 0.5     | 0.3     | 7.92   | 39.8         |
| 12 w  | 15     | 3      | 0.3     | 0.2     | 7.92   | 18.5         |
| 16 w  | 7      | 2      | 0.15    | 0.1     | 7.92   | 9.25         |
| 20 w  | 2      | 0.5    | 0.1     | 0.1     | 7.92   | 2.7          |

FIG. 1 shows the plot of contamination with boron against time.

Example 1

In the air handling system, coarse dust filters of the G4 class made from synthetic polypropylene are present at the first stage, and fine dust filters of the M6 class made from synthetic polyester material at the second stage.

According to analytical studies, the filter mats of the coarse dust filter and the fine dust filter contain less than 0.1% by weight of boron and phosphorus and less than 0.01% by weight of arsenic and aluminum.

In the cleanroom, brother rods were laid out.

After 6 hours, the values for the surface contamination reported in table 4 were measured.

TABLE 4

| B/ppta | P/ppta | Al/ppta | As/ppta | C/ppba | Dopants/ppta |
|---|---|---|---|---|---|
| 4 | 0.2 | 0.01 | 0.001 | 7.92 | 2.21 |

Example 2

In the air handling system, filters of the M6 class made from synthetic polyester material are present.

According to analytical studies, the filter mats contain less than 0.1% by weight of boron and phosphorus and less than 0.01% by weight of arsenic, 0.01% by weight of aluminum and 0.2% by weight of tin.

In the cleanroom, brother rods were laid out.

After 6 hours, the values for the surface contamination reported in table 5 were measured.

TABLE 5

| B/ppta | P/ppta | Al/ppta | As/ppta | C/ppba | Dopants/ppta |
|---|---|---|---|---|---|
| 3 | 0.1 | 0.005 | 0.002 | 6.85 | 3.107 |

On a laid-out silicon chunk, after 2 hours, tin values of 100 pptw were measured.

The chunk was analyzed as described in U.S. Pat. No. 6,309,467 B1.

For this purpose, the chunk is sprayed with $HF/HNO_3$. The etching acid is collected in a cup. Subsequently, the acid is evaporated off and the residue is introduced into water. The metal content of the aqueous solution is measured by means of ICP-AES (inductively coupled ion plasma atomic emission spectroscopy). The measured values are used to calculate the metal content of the poly surface.

Example 3

In the air handling system, filters of the M6 class made from synthetic polyester material are present.

According to analytical studies, the filter mats contain less than 0.1% by weight of boron and phosphorus and less than 0.01% by weight of arsenic, 0.01% by weight of aluminum and 0.02% by weight of tin.

In the cleanroom, brother rods were laid out.

After 6 hours, the values for the surface contamination reported in table 6 were measured.

TABLE 6

| B/ppta | P/ppta | Al/ppta | As/ppta | C/ppba | Dopants/ppta |
|---|---|---|---|---|---|
| 2.5 | 0.15 | 0.007 | 0.0015 | 5.92 | 2.6585 |

On a laid-out silicon chunk, after 2 hours, tin values of 5 pptw were measured. The chunk was again analyzed as described in U.S. Pat. No. 6,309,467 B1.

The invention claimed is:

1. A process for producing polycrystalline silicon, comprising depositing polycrystalline silicon on at least one support body, in order to obtain at least one polycrystalline silicon rod, or depositing polycrystalline silicon on silicon particles, in order to obtain polycrystalline silicon granules, wherein deposition is effected in a reactor within a cleanroom of the 1 to 100,000 class, and conducting filtered air into the cleanroom, wherein the air is preliminarily filtered by first passing it through at least one coarse filter which separates out particles larger than or equal to 10 µm, the coarse filter being a filter of the G4 class constructed from polypropylene, and/or through a fine dust filter of the M6 class constructed from polyester, and then, following preliminary filtration, passing the preliminarily filtered air through an airborne particle filter which separates out particles smaller than 1 µm, wherein the coarse filter and fine dust filter contain less than 0.1% by weight of boron and phosphorus and less than 0.01% by weight of arsenic and aluminum.

2. The process of claim 1, wherein the airborne particle filter is an airborne particle filter with a PTFE membrane.

3. The process of claim 2, further comprising comminuting at least one polycrystalline silicon rod into chunks by a comminution system, wherein the comminuting of the polycrystalline silicon rods to polycrystalline silicon chunks takes place in a cleanroom of the 1 to 100,000 class, wherein the same filters are used as in the depositing.

4. The process of claim 1, wherein fine and coarse dust filters, each contain less than 0.01 % by weight of sulfur and less than 0.1 % by weight of Sn.

5. The process of claim 1, wherein all adhesives and frames in which the filters are installed contain less than 0.1 % by weight of boron and phosphorus, less than 0.01 % by weight of arsenic and aluminum, and less than 0.1 % by weight of Sn.

6. The process of claim 1, further comprising comminuting at least one polycrystalline silicon rod into chunks by a comminution system, wherein the comminuting of the polycrystalline silicon rods to polycrystalline silicon chunks takes place in a cleanroom of the 1 to 100,000 class, wherein the same filters are used as in the depositing.

7. The process of claim 6, further comprising subjecting the polycrystalline silicon chunks to a wet-chemical treatment in a cleaning apparatus and optionally subsequently drying in a dryer, wherein the cleaning apparatus and the dryer are located within a cleanroom of the 1 to 100,000 class, wherein the same filters are used as in the depositing.

8. The process of claim 6, further comprising packing the polycrystalline silicon chunks into plastic bags, wherein the packing is performed within a cleanroom of the 1 to 100,000 class, wherein the same filters are used as in the depositing, with the proviso that, in the case of a wet-chemical treatment and optionally of a subsequent drying operation of the polycrystalline silicon chunks, any transport line from cleaning system and/or drier to the packing system is likewise within a cleanroom of the 1 to 100,000 class, wherein the same filters are used as in the depositing.

9. The process of claim 1, wherein polycrystalline silicon chunks derived from comminuting the polycrystalline silicon rod, or the polycrystalline silicon granules are classified, wherein the classification apparatus is within a cleanroom of the 1 to 100,000 class, wherein the same filters are used as in the depositing.

* * * * *